United States Patent [19]
Buhr et al.

[11] Patent Number: 5,292,626
[45] Date of Patent: Mar. 8, 1994

[54] DEVELOPER COMPOSITION FOR IRRADIATED, RADIATION-SENSITIVE POSITIVE-WORKING, NEGATIVE-WORKING AND REVERSIBLE REPROGRAPHIC LAYERS

[75] Inventors: Gerhard Buhr, Koenigstein; Andreas Elsaesser, Idstein; Hans W. Frass, Wiesbaden; Ernst I. Leupold, Neu-Anspach, all of Fed. Rep. of Germany

[73] Assignee: Hoechst Aktiengesellschaft, Frankfurt am Main, Fed. Rep. of Germany

[21] Appl. No.: 750,313

[22] Filed: Aug. 27, 1991

[30] Foreign Application Priority Data

Aug. 29, 1990 [DE] Fed. Rep. of Germany ....... 4027299

[51] Int. Cl.$^5$ ................................................ G03F 7/32
[52] U.S. Cl. ................................. 430/331; 430/309; 430/325; 430/326
[58] Field of Search ............... 430/309, 331, 326, 325; 134/38; 252/139, 158, 170, DIG. 8

[56] References Cited

U.S. PATENT DOCUMENTS

| | | | |
|---|---|---|---|
| 3,586,504 | 6/1971 | Coats et al. | 96/35.1 |
| 4,374,920 | 2/1983 | Wanat et al. | 430/331 |
| 4,506,006 | 3/1985 | Ruckert | 430/325 |
| 4,530,895 | 7/1985 | Simon | 430/154 |
| 4,824,769 | 4/1989 | Lewis et al. | 430/326 |
| 4,945,030 | 7/1990 | Turner et al. | 430/331 |
| 5,106,724 | 4/1992 | Nogami et al. | 430/309 |

FOREIGN PATENT DOCUMENTS

| | | |
|---|---|---|
| 0178495B1 | 4/1986 | European Pat. Off. . |
| 0178496A2 | 4/1986 | European Pat. Off. . |
| 0209153A3 | 1/1987 | European Pat. Off. . |
| 0274044A1 | 7/1988 | European Pat. Off. . |
| 0279630A1 | 8/1988 | European Pat. Off. . |
| 3915141A1 | 11/1989 | Fed. Rep. of Germany . |
| 1309092 | 3/1973 | United Kingdom ................ 252/139 |

OTHER PUBLICATIONS

Grant & Hackh's Chemical Dictionary Fifth Edition, 1987 pp. 564 & 627.

*Primary Examiner*—Marion E. McCamish
*Assistant Examiner*—Janis L. Dote
*Attorney, Agent, or Firm*—Foley & Lardner

[57] ABSTRACT

The present invention relates to a developer composition for radiation-sensitive positive-working and negative-working and reversible reprographic layers which apart from a radiation-sensitive compound or radiation-sensitive combination of compounds contain, as an essential constituent, a binder which is insoluble in water but soluble in aqueous-alkaline solutions, said developer composition being characterized in that it contains, as essential constituents, (a) O- carboxymethyl- or O,O'-biscarboxymethylethylene glycol or an appropriately substituted polyethylene glycol comprising 2 to about 500 ethylene glycol units,
(b) at least one compound showing an alkaline reaction in water, selected from the group including alkali metal hydroxides, alkali metal silicates, alkali metal phosphates, alkali metal borates, ammonium hydroxides, ammonium silicates, ammonium phosphates and ammonium borates, and
(c) water.

The developer composition gives a very good yield, makes possible short developing times and does not cause any problems due to flaky deposits of layer constituents or foaming. A process for developing positive-working, negative-working and reversible reprographic layers with the developer composition is also disclosed.

20 Claims, No Drawings

DEVELOPER COMPOSITION FOR IRRADIATED, RADIATION-SENSITIVE POSITIVE-WORKING, NEGATIVE-WORKING AND REVERSIBLE REPROGRAPHIC LAYERS

BACKGROUND OF THE INVENTION

The present invention relates to a developer composition for radiation-sensitive positive-working, negative-working, and reversible reprographic layers which, apart from a radiation-sensitive compound or radiation-sensitive combination of compounds, contain, as an essential constituent, a binder which is insoluble in water but soluble in aqueous-alkaline solutions. The developer composition exhibits particularly advantageous properties with respect to yield, developing speed and differentiation between image areas and non-image areas, and it does not tend to form foam or undesirable deposits. The developer composition provides a steep gradation when positive-working, negative-working, or reversible reproduction layers based on photopolymers or epoxides are processed. The invention is also directed to a process for developing reprographic layers with the developer composition.

Positive-working reprographic layers containing photosensitive compounds which, upon exposure, render the exposed areas soluble in an aqueous-alkaline developer solution, are known. In most cases, layers of this kind contain 1,2-quinonediazides as photosensitive compounds. Alkali-soluble resins, such as phenolic resins, may additionally be contained in these layers.

Layers containing a combination of a compound which forms an acid upon irradiation and an acid-cleavable compound, such as an orthocarboxylic acid derivative, a monomeric or polymeric acetal, an enol ether, a silyl ether and an acyliminocarbonate, are also known. Organic halogen compounds, in particular halomethyl-substituted s-triazines, are generally used as the radiation-sensitive, acid-eliminating compounds. Here, too, alkali-soluble resins are employed as binders.

Positive-working copying materials based on 1,2-quinonediazides, optionally in the presence of suitable additives, have also been used as negative-working copying materials, by subjecting the material to a certain sequence of processing steps. A positive-negative reversal process for a material based on acid-cleavable compounds instead of 1,2-quinonediazides is described in EP 082,463 (=U.S. Pat. No. 4,506,006).

Known reversal processes principally comprise the same sequence of processing steps, i.e., following exposure the printing plate is heated, cooled down, then post-exposed without an original and finally developed with an aqueous-alkaline developer. For practical application of the reversal process, safe performance of the individual process steps and reliable reproducibility of the results within narrow limits are of vital importance.

Negative-working, radiation-sensitive systems include combinations of ethylenically unsaturated monomers and photoinitiators and combinations of epoxide compounds and substances which upon irradiation eliminate a strong acid. Combinations of the above systems are also known. These reprographic layers contain binders which are soluble in aqueous-alkaline systems, preferably polycondensates or polymers having lateral carboxyl groups.

A developer composition and a developing process for radiation-sensitive layers or, respectively, reproduction materials produced therefrom, must meet a number of requirements, in particular:

1. The yield of the developer solution should be high, i.e., the performance of the developer with regard to the reprographic layer should remain as constant as possible, even when the developer is loaded with an increasing amount of removed layer constituents, and the tone limit, i.e., that degree of loading of the developer where the layer is no longer removed completely from the substrate, should be as high as possible.

2. The developing process should be finished after a short period of action of the developer on the layer. This is of particular importance when processing is performed with automated developing stations which are part of processing lines. Due to short processing cycles the times allowed for development in some cases are well below 30 seconds.

3. The resistance to overdevelopment should be good, i.e., in case of positive processing, the unexposed layer areas should not be attacked by the developer; in case of negative processing, the exposed layer areas should not be attacked by the developer and in the case of reversal processing, the exposed and heat-treated-layer areas should not be attacked by the developer. This ensures that, even in the case of repeated development, for example, in the course of photocomposing, the image is not damaged. Furthermore, even relatively old copying layers can be satisfactorily processed.

4. During development foaming should not occur and deposits should not form. These soil a developing apparatus, necessitating increased expenditure for maintenance.

5. The gradation, which is strongly influenced by the type of developer employed, should be as steep as possible. This makes improved dot reproduction possible with both positive and negative processing.

It is generally very difficult to provide a developer which fulfills all of the above requirements, particularly for reversal processing. EP 101,010 (=U.S. Pat. No. 4,530,895) discloses an aqueous-alkaline developer solution which contains silicate, benzoate and quaternary ammonium hydroxides and which results in a steep gradation following development. However, this developer impairs the hydrophilic character of the substrate material if used to develop printing plates, making its application very problematic.

DE 32 23 386 (=U.S. Pat. No. 4,374,920) and U.S. Pat. No. 3,586,504 disclose the addition of non-ionic surfactants, such as fatty acid amides or ethoxylated alkanols, alkyne diols and phenols, to the aqueous-alkaline developer solution. When developer solutions of this kind are used, steep gradations and short developing times are achieved, but the formation of deposits of layer constituents causes the problems described above.

EP 178,495 describes a multi-stage process for developing irradiated, radiation-sensitive, positive-working layers containing quinonediazide sulfonic acids and alkali-soluble resins, wherein the irradiated layers are treated with aqueous-alkaline solutions containing a fluorocarbon or a carboxylated surface-active agent. The carboxylated surfactants also include (poly)glycols etherified with a fatty alcohol and with hydroxyacetic acid, hydroxypropionic acid or hydroxybutaric acid.

The aqueous-alkaline developers disclosed in EP 178,496 and EP 209,153, which are based on O-fatty alkyl-O'-carboxymethyl-(poly)ethylene glycol, and the aryl ether sulfates disclosed in DE 39 15 141, provide excellent developing results. However, these developers exhibit an unacceptably strong foam formation.

EP 279,630 discloses a developer for positive-working and negative-working copying layers which are based on quinonediazides or diazonium salts, respectively. The developer comprises a substance showing an alkaline reaction, a reducing agent, a non-ionic or cationic surfactant and an aromatic carboxylic acid, such as, for example, benzoic acid, which may be substituted on the aromatic ring. The content of non-ionic or cationic surfactants leads to the same impairments during processing as described above. The publication does not disclose the use of the developer in reversal processes.

EP 274,044 is directed to a developer solution which is suited, in particular, for the processing of reversible reproduction layers. The developer solution contains, as essential constituents, alkali, an ethylene oxide/propylene oxide block copolymer and optionally a phosphate ester in order to prevent the formation of deposits. This developer composition gives good results even when reversible copying layers are processed. However, the amount of phosphate ester required effectively to suppress the formation of deposits causes foaming of the developer solution, and hence the composition of the developer is not ideal.

SUMMARY OF THE INVENTION

It is therefore an object of the present invention to provide a developer composition for radiation-sensitive positive-working, negative-working and reversible reprographic layers, which, apart from the radiation-sensitive compound or radiation-sensitive combination of compounds contains, as an essential constituent, a binder which is insoluble in water but soluble in aqueous-alkaline systems, which developer meets the requirements set up above.

Another object of the invention is to provide a process for developing irradiated radiation-sensitive layers of the above types with the aid of a developer composition satisfying the above demands.

In accordance with these and other objects according to the invention, a developer composition is provided which contains, (a) O-carboxymethyl- or O,O'-bis-carboxymethylethylene glycol or an appropriately substituted polyethylene glycol comprising from 2 to about 500 ethylene glycol units, (b) at least one compound selected from the group consisting of alkali metal hydroxides, alkali metal silicates, alkali metal phosphates, alkali metal borates, ammonium hydroxides, ammonium silicates, ammonium phosphates and ammonium borates, and (c) water.

The developer according to the invention can be used to develop irradiated, radiation-sensitive layers in a positive-working, negative-working or reversal process.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Developer compositions according to the invention contain:

(a) O-carboxymethyl- or O,O'-bis-carboxymethylethylene glycol or an appropriately-substituted polyethylene glycol comprising from 2 to about 500 ethylene glycol units, (b) at least one compound selected from the group consisting of alkali metal hydroxides, alkali metal silicates, alkali metal phosphates, alkali metal borates, ammonium hydroxides, ammonium silicates, ammonium phosphates and ammonium borates, and (c) water.

Particular preference is given to O-carboxymethyl- or O,O'-bis-carboxymethylpolyethylene glycols comprising about 5 to about 50 ethylene glycol units. The amount of etherified (poly)ethylene glycol contained in the developer depends on the degree of condensation of the polyether segment, and also on the type and amount of the further substances added to the developer, the pH value, and the type of copying layer to be treated. In the case of a high degree of condensation, a lower amount of the glycol is required. Appropriately, the optimum amount is determined by tests in each case; generally it is about 0.01 to 20% by weight, preferably about 0.1 to 10% by weight, relative to the total weight of the composition. The (poly)ethylene glycols etherified (formally) with hydroxyacetic acid are prepared either by a Williamson ether synthesis from the corresponding glycols and chloroacetic acid or, advantageously, by oxidation which is optionally performed in the presence of catalysts, as described, for example, in DE 29 36 123.

Of the alkaline compounds, preference is given to alkali metal hydroxides, ammonium hydroxide and tetraalkylammonium hydroxide and—if the layer substrate is attacked by hydroxyl ions—alkali metal silicates and ammonium silicates. The added amount has to be matched to the copying layers to be processed and is generally about 1 to 20% by weight, preferably about 5 to 10% by weight, relative to the total weight of the composition.

Depending on the type of copying layer to be processed it may be expedient to incorporate further additives into the developer. If very short developing times are to be achieved or if a high proportion of negative-working copying layers is to be processed, it is expedient to add solvents, in particular alcohols, such as glycol ethers. However, the added amount of solvent should preferably be less than about 2% by weight, since the resistance of the copying layer to overdevelopment is generally reduced by the addition of such solvents.

Furthermore, the developer composition may include one or more surface-active substance(s), which regulate the surface tension. In particular, in those cases where the developer is applied by spraying, a maximum surface tension of 50 mN/m is desirable in order to ensure a rapid wetting of the copying layer. It is possible to use cationic, anionic, amphoteric and non-ionic surfactants or combinations of surfactants.

If a developer is to be marketed in the form of a concentrate which has to be diluted with water prior to use, the composition expediently also contains sequestering agents, i.e., agents which bind multivalent metal ions in an anionic complex, in order to prevent precipitations in those cases where dilution is performed with hard tap water. In particular, these softeners for hard water include phosphates, such as $Na_2P_2O_7$, $Na_5P_3O_3$, $Na_3P_3O_9$, $Na_2O_4P(NaO_3P)PO_3Na_2$ or Calgon ® (sodium polymetaphosphate), polyaminocarboxylic acids or salts thereof, such as ethylenediaminetetraacetic acid and its sodium and potassium salts, diethylenetriaminepentaacetic acid and its sodium and potassium salts, triethylenetetramine-hexaacetic acid and its sodium and potassium salts, hydroxyethylethylenediamine-triacetic acid and its sodium and potassium salts, nitrilotriacetic acid and its sodium and potassium salts, cyclohexane-1,2-diaminetetraacetic acid and its sodium and potassium salts and 2-hydroxypropane-1,3-diamine-tetraacetic acid and its sodium and potassium salts. These softeners can be used alone or in combination with one another. The optimum amount depends on the hardness of the added water, but is generally about 0.01 to 0.5% by weight, relative to the total weight of the ready-for-use developer.

For copying layer substrates that are susceptible to attack by the alkaline developer solutions, such as, for example, anodically-oxidized aluminum foils, it is advantageous to add corrosion inhibitors to the developer compositions. Particularly suitable corrosion inhibitors include the metal salts described in DE 28 34 958 and EP 071,823 and the lithium compounds described in EP 071,823.

In addition, hydrotropic substances, such as arylsulfonates, arylcarboxylates or phosphate esters, can be added to the developer if the developer contains additives, for example, for improving the resistance to overdevelopment, which may lead to the formation of precipitates during development. If the developer contains relatively large amounts of surfactant(s) it is also appropriate to add an antifoam agent.

Preferred positive-working layers include those based on 1,2-quinonediazides, in particular on esters or amides of 1,2-naphthoquinone-2-diazide-4-sulfonic or -carboxylic acid or 1,2-naphthoquinone-2-diazide-5-sulfonic or -carboxylic acid. Suitable compounds of this kind are, for example, known from DE 938,233 (=GB 739,654).

Reversible layers preferably contain the derivatives of 1,2-naphthoquinone-2-diazide-4-sulfonic acid and further additives by which the process latitude for image reversal is increased, as are described, for example, in DE 37 11 263 and in German Patent application P 40 04 719.9.

It is also possible to use positive-working reversible layers which contain a combination of compounds comprising at least one acid-cleavable C—O—C bond and a compound which upon irradiation splits off a strong acid.

Examples of acid-cleavable compounds include:
(a) orthocarboxylic acid esters and carboxylic acid amide acetals which may have a polymeric character and which contain orthoester groups or amide acetal groups as linking elements, either in their main chains or laterally;
(b) oligomeric or polymeric compounds possessing recurring acetal and/or ketal groups in their main chains;
(c) compounds possessing at least one enol ether or acyl iminocarbonate group; and
(d) compounds possessing at least one silyl ether group.

Acid-cleavable compounds of type (a) as components of radiation-sensitive mixtures are described in EP 033,571 (=U.S. Pat. No. 4,311,782). Mixtures containing compounds of type (b) are described in DE 23 06 248 (=U.S. Pat. No. 3,779,778). Compounds of type (c) are known from EP 006,627 (=U.S. Pat. No. 4,248,957). Compounds of type (d) are known from EP 130,599, DE 35 44 165 and DE 36 28 046.

Suitable photosensitive components which upon irradiation eliminate a strong acid include a great number of known compounds and mixtures, such as phosphonium salts, sulfonium salts and iodonium salts, halogen compounds and organometal/organohalogen combinations.

The above phosphonium, sulfonium and iodonium compounds are generally used in the form of their salts which are soluble in organic solvents, in most cases as separation products with hexafluorophosphoric acid, hexafluoroantimonic acid and hexafluoroarsenic acid. In principle, any organic halogen compounds known as photochemical free-radical initiators, for example, those having at least one halogen atom on a carbon atom or on an aromatic ring, are useful as halogen-containing photosensitive compounds forming hydrohalic acid. Of these compounds, the s-triazine derivatives which are substituted with halomethyl groups, in particular trichloromethyl groups, and with an aromatic or unsaturated substituent, such as are described in DE 27 18 259 (=U.S. Pat. No. 4,189,323), are preferred. It is also possible to employ 2-trichloromethyl-(1,3,4)-oxadiazoles (DE 28 51 471=U.S. Pat. No. 4,212,970). The effect of these halogen-containing compounds can also be influenced and increased spectrally by known sensitizers.

The binders which are used for these layers are, for example, polycondensation products or polymers having free phenolic hydroxyl groups, the amount of phenolic hydroxyl groups being preferably in the range from about 2 to 9 mmol/g of binder. Examples of polycondensation products are phenolic resins of the novolak type or hydroxyl-substituted aramides. Examples of polymers are homo- and copolymers of vinylphenols (DE 23 22 230=U.S. Pat. No. 3,869,292), polymers of esters of acrylic acids with phenols (EP 212,439) or copolymers of hydroxyphenyl maleimides (EP 187,517). Binders containing N-H-acidic groups are also suitable, such as those described in U.S. Pat. No. 4,720,445 or DE 34 45 276.

Suitable negative-working mixtures include, in particular, those which are a combination of olefinically unsaturated compounds, particularly acrylates and methacrylates of polyhydric alcohols, with photoinitiators, or a combination of compounds, which upon irradiation form a strong acid, with compounds which in the presence of an acid undergo a polyaddition reaction. It is also possible to combine compounds having different principles of action, as described, for example, in EP 167,933 and EP 184,725.

Suitable binders for negative-working mixtures include the same resins as described above. Preference is, however, given to resins having lateral carboxyl groups, such as those described in DE 34 04 366 and in DE 36 38 757.

To meet special requirements, such as flexibility, adhesion and gloss, the photosensitive layer can additionally contain a number of other substances, such as polyglycols, cellulose ethers, e.g., ethyl cellulose, wetting agents, etc. Dyes or finely-dispersible pigments may also be added to the photosensitive mixture.

In most cases, metals are used as substrates for layers having thicknesses of less than about 10 μm. Substrates for offset printing plates include mill-finished, mechanically- and/or electrochemically-grained and optionally anodically-oxidized aluminum, which in addition can have been chemically pretreated, for example, with polyvinylphosphonic acid, silicates, phosphates, hexafluorozirconates or hydrolyzed tetraethyl orthosilicate. The substrate is coated in a known manner by spin-coating, spraying, dip-coating, roller application, by means of flat film dies, by spreading with the aid of doctor blades or by curtain coating.

For exposure, the customary light sources, such as fluorescent lamps, pulsed xenon lamps, metal halide-doped mercury vapor high pressure lamps and carbon arc lamps, are used. Exposure or irradiation in this description is understood to mean the effect of actinic electromagnetic radiation in the wavelength range below about 500 nm. Any radiation sources emitting in this wavelength range are suitable in principle. Laser beam devices, in particular automatic processing units, which contain, for example, an argon or krypton ion laser as the radiation source can be used with advantage. Irradiation can also be carried out using electron beams or X-ray beams.

Following imagewise or overall exposure or irradiation, the layer can be developed in the customary manner with the developer composition according to the invention. Preferably, development is performed in a spray or immersion processor or in a developer bath at temperatures between about 1820 and 50° C. Development time ranges from about five seconds to about one minute.

Development can be followed by further processing steps. In the case of printing plate production, these comprise, for example, a hydrophilizing treatment with acidic solutions, the application of preserving coatings or the application of so-called baking solutions if the plates are to be heated to elevated temperatures for a short time, such as is known for diazo layers from GB 1,154,749, in order to increase their print run or their resistance to washing-out agents, correction fluids and UV-hardenable printing inks.

The examples below illustrate preferred embodiments of the invention. Parts by weight (pbw) and parts by volume (pbv) bear the same relationship as g and cm$^3$. Unless otherwise specified, percentages and ratios are given in weight units.

PREPARATION OF RADIATION-SENSITIVE COMPOSITIONS

Coating solutions are prepared in accordance with Table 1 below and spin-coated onto aluminum substrates which have been grained, anodically-oxidized in sulfuric acid and hydrophilized with polyvinylphosphonic acid. The speed (rpm) of the centrifuge is adjusted such that dry layer thicknesses of 2 um are obtained. Drying is performed for 2 minutes at 100° C. The materials coated with photosensitive mixtures Nos. 4, 5 and 7 are additionally coated with a 0.2 μm thick, non-photosensitive top layer comprising an aqueous solution of polyvinyl alcohol (K-value 4, residual acetyl group content 12%). For mixtures whose mode of action is based on the acid-catalyzed cleavage of C—O—C bonds, the application of top layers of this type is advantageous in order to prevent premature ageing of the reproduction layers and to make available a wide temperature range for the thermal post-treatment in the case of positive processing (see, e.g., DE 37 15 790). In the case of photopolymerizable layers, the polyvinyl alcohol top layers serve as oxygen barrier layers (see, e.g., DE 15 72 162).

TABLE 1

Mixture 1 (reversible):
8.00 pbw of a m-cresol/formaldehyde novolak having a mean molecular weight $\overline{M}_w$ of 6,000 (determined by means of gel permeation chromatography (GPC)),
1.60 pbw of an esterification product obtained from 1 mol of 1,2-naphthoquinone-2-diazide-4-sulfonyl chloride and mol of 4-(2-phenylprop-2-yl)phenol,
0.40 pbw of 2,4-diethoxy-6-diethylamino-s-triazine according to DE 37 11 263, as a base,
0.10 pbw of Crystal Violet (C.I. 42,555), and
0.02 pbw of Sudan Yellow GGN (C.I. 11,021), in
100.00 pbw of a solvent mixture comprising tetrahydrofuran and propylene glycol monomethyl ether (55:45).

Mixture 2 (reversible):
8.50 pbw of a m-cresol/formaldehyde novolak as in mixture 1,
1.70 pbw of an esterification product obtained from 1 mol of 2,3,4-trihydroxybenzophenone and 1 mol of 1,2-naphthoquinone-2-diazide-4-sulfonyl chloride,
0.06 pbw of 2,4-bis-trichloromethyl-6-p-stilbenyl-s-triazine, and
0.07 pbw of Crystal Violet (C.I. 42,555), in
50.00 pbw of propylene glycol monomethyl ether, and
50.00 pbw of tetrahydrofuran.

Mixture 3 (positive-working):
8.00 pbw of a m-cresol/formaldehyde novolak as in mixture 1,
1.60 pbw of an esterification product obtained from 1 mol of 2,3,4-trihydroxybenzophenone and 3 mol of 1,2-naphthoquinone-2-diazide-5-sulfonyl chloride,
0.25 pbw of 1,2-naphthoquinone-2-diazide-4-sulfonyl chloride, and
0.07 pbw of Crystal Violet (C.I. 42,555), in
100.00 pbw of the solvent mixture of mixture 1.

Mixture 4 (reversible):
5.00 pbw of a polymer obtained from 2-hydroxyphenyl methacrylate having a mean molecular weight $\overline{M}_w$ of 20,000 (GPC) and a hydroxyl number of 280,
1.40 pbw of an oligomeric acetal obtained by polycondensation of triethylene glycol and 2-ethyl butyraldehyde, hydroxyl number 140,
0.20 pbw of 2-(4-styrylphenyl)-4,6-bis-trichloromethyl-s-triazine, and
0.03 pbw of Crystal Violet (C.I. 42,555), in
100.00 pbw of the solvent mixture as in mixture 1.

Mixture 5 (positive-working):
8.00 pbw of the polymeric binder described for mixture 4,
0.50 pbw of an esterification product obtained from 3 mol of 1,2-naphthoquinone-2-diazide-5-sulfonyl chloride and 1 mol of 2,3,4-tri-hydroxybenzophenone,
1.20 pbw of the oligomeric acetal as in mixture 4,
0.15 pbw of 2-(4-styrylphenyl)-4,6-bis-trichloromethyl-s-triazine, and
0.03 pbw of Crystal Violet (C.I. 42,555), in
100.00 pbw of the solvent mixture as in mixture 1

Mixture 6 (reversible):

8.00 pbw of a m-cresol/formaldehyde novolak having a mean molecular weight $\overline{M}_w$ of 6,000 (GPC),
1.60 pbw of an esterification product obtained from 1 mol of 1,2-naphthoquinone-2-diazide-4-sulfonyl chloride and 1 mol of 2,3,4-tri-hydroxybenzophenone,
0.50 pbw of a reaction product obtained from 1 mol of polyethylene glycol 400 and 2 mol of phenylisocyanate according to German Patent Application P 40 04 719.9,
0.07 pbw of Crystal Violet (C.I. 42,555), and
0.02 pbw of Sudan Yellow GGN (C.I. 11,021), in
100.00 pbw of a solvent mixture comprising tetrahydrofuran and propylene glycol monomethyl ether (55:45).

Mixture 7 (negative-working):
10.00 pbw of a copolymer comprised of methacrylic acid and methyl methacrylate, acid number 190,
3.20 pbw of trimethylolpropane triacrylate,
0.08 pbw of 9-phenylacridine,
0.05 pbw of dibenzalacetone, and
0.07 pbw of a blue dyestuff having the following structure:

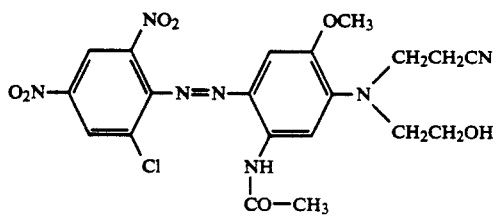

in
100.00 pbw of a solvent mixture as described in mixture 1.

Graining of the substrate materials:
Mixture 1: Hydrochloric acid
Mixture 2: Hydrochloric acid
Mixture 3: Nitric acid
Mixture 4: Hydrochloric acid
Mixture 5: Wet brushing
Mixture 6: Combination of wet brushing and graining with hydrochloric acid
Mixture 7: Hydrochloric acid

EXAMPLE 1

Positive processing of copying layers containing 1,2-cuinonediazides

Recording material No. 3, prepared according to Table 1, is exposed through a 13-step continuous-tone step wedge having density increments of 0.15 (exposure test wedge 'BK 01', available from HOECHST AG), for 60 seconds by means of a 5 kW metal halide lamp arranged at a distance of 110 cm from the material, and is then developed using a developer as specified in Table 2 below.

The following test criteria were employed:
1. Clear Step: Clear step and gradation (number of ghost steps from solid to clean) after a development time of 30 seconds;
2. Development: Development for 5 seconds to test the developing behavior (occurrence of tone);
3. Developer Yield: In this test, 10 m² of copying layer are developed with 1 liter of developer; then a test is performed to find out whether tone-free development is still possible;
4. Resistance to Overdevelopment: The object of this test is to find out whether after a threefold development time (i.e., after 90 seconds), the finest screen areas of a copied half-tone wedge are damaged.
5. Impairment of Development: Formation of foam and flaky deposits was assessed.

The test results are compiled in Table 3 below. They show that by employing the developer compositions of the instant invention, short development times, good developer yield and a steep gradation can be achieved without adversely affecting resistance to overdevelopment or the general developing behavior. None of the developer solutions used for comparative tests was able to meet all of the above requirements.

| Developer No. | Active Substance(s) | Amount of wt. % |
| --- | --- | --- |
| 1 (C) | Potassium silicate | 7.6 |
| 2 (C) | Potassium silicate | 8.6 |
| 3* (C) | Potassium silicate plus $\bigcirc\!\!\bigcirc\!\!-\!\!O(CH_2CH_2O)_4\!-\!SO_3Na$ | 8.6 |
| 4** (C) | Potassium silicate plus $C_{12}H_{25}\!-\!O\!-\!CH_2\!-\!CH_2\!-\!OCH_2COOH$ | 8.6 0.2 |
| 5*** (C) | Potassium silicate plus Triton ® H66 (Röhm & Haas) plus Synperonic ® T 304 (ICI) (ethylene oxide/propylene-oxide copolymer) | 8.6 2.5 0.2 |
| 6*** (C) | as 5(C), but without Triton ® H66 | |
| 7 | Potassium silicate plus O,O'-bis-carboxymethyl-polygloycol-600 | 8.6 0.5 |
| 8 | Potassium silicate plus O,O'-bis-carboxmethyl-polyglycol-1000 | 8.6 0.5 |

(C) Comparison
*according to DE 39 15 141
**according to EP 178 496
***according to EP 274 044

| Example No. | Developer No. | Clean Step | Gradation | Development | Developer Consumption (ml/m²) | Resistance to Overdevelopment (min) | Impairment of Development |
| --- | --- | --- | --- | --- | --- | --- | --- |
| 1-1 (C) | 1 | 3 | 4 | tone | >100 | >1 | — |
| 1-2 (C) | 2 | 4 | 5 | tone-free | <100 | <1 | — |
| 1-3 (C) | 3 | 3 | 3 | tone-free | <100 | >1 | foam |
| 1-4 (C) | 4 | 3 | 3 | tone-free | <100 | >1 | foam |
| 1-5 (C) | 5 | 3 | 3 | tone-free | <100 | >1 | foam |
| 1-6 (C) | 6 | 3 | 3 | tone-free | <100 | >1 | flaky deposit |
| 1-7 | 7 | 3 | 3 | tone-free | <100 | >1 | — |

-continued

| Example No. | Developer No. | Clean Step | Grada- tion | Develop- ment | Developer Consump- tion (ml/m$^2$) | Resistance to Over- development (min) | Impair- ment of Develop- ment |
| --- | --- | --- | --- | --- | --- | --- | --- |
| 1-8 | 8 | 3 | 3 | tone-free | <100 | >1 | — |

C = Comparative Example

EXAMPLE 2

Positive processing of various copying layers containing 1,2-quinonediazides

Recording materials produced in accordance with Table 1 are exposed, developed and evaluated as described in Example 1. Table 4 below summarizes the results obtained and shows that even in the case of varying copying layer compositions (1,2-quinonediazide compound, contrast enhancer, dyestuff, reversing agent) excellent results are achieved with the developer compositions according to this invention.

TABLE 4

| Example No. | Radiation-sensitive Composition No. (Table 1) | Developer No. (Table 2) | Clean Step | Gradation | Development | Developer Consumption (ml/m$^2$) | Resistance to Overdevelop- ment | Impariment of Development |
| --- | --- | --- | --- | --- | --- | --- | --- | --- |
| 2-1 (C) | 1 | 1 | 3 | 4 | tone | >100 | >1 | — |
| 2-2 | 1 | 7 | 3 | 3 | tone-free | <100 | >1 | — |
| 2-3 (C) | 2 | 1 | 3 | 4 | tone | >100 | >1 | — |
| 2-4 | 2 | 7 | 3 | 3 | tone-free | <100 | >1 | — |
| 2-5 (C) | 6 | 1 | 3 | 4 | tone | >100 | >1 | — |
| 2-6 | 6 | 7 | 3 | 3 | tone-free | <100 | >1 | — |

C = Comparative Example

EXAMPLE 3

Reversal processing

Reversible copying layers according to Table 1 above were tested and evaluated. The recording materials were exposed for 40 seconds under the conditions specified in Example 1, were then subjected to a conversion treatment in a circulating air cabinet at 130° C. for two minutes, and were subsequently exposed without an original for 40 seconds. The following characteristics were evaluated, using the test criteria described in Example 1:

1. Solid step
2. Development
3. Resistance to overdevelopment
4. Yield of developer
5. Impairment of developing process The test results are compiled in Table 5 below. Here again, it can be seen that in each case at least one essential criterion is not fulfilled by the comparative developer solutions.

| Example No. | Radiation sensitive Composi- tion (Table 1) | Developer No. (Table 2) | Clean Step | Develop- ment | Developer Consump- tion (ml/m$^2$) | Resistance to Overde- velopment (min) | Impair- ment of Develop- ment |
| --- | --- | --- | --- | --- | --- | --- | --- |
| 3-1 (C) | 1 | 1 | 2 | tone | >100 | >1 | — |
| 3-2 (C) | 1 | 2 | 1 | tone-free | <100 | <1 | — |
| 3-3 (C) | 1 | 3 | 2 | tone-free | <100 | >1 | foam |
| 3-4 (C) | 1 | 4 | 2 | tone-free | <100 | >1 | foam |
| 3-5 (C) | 1 | 5 | 2 | tone-free | <100 | >1 | foam |
| 3-6 (C) | 1 | 6 | 2 | tone-free | <100 | >1 | flaky deposit |
| 3-7 | 1 | 7 | 2 | tone-free | <100 | >1 | — |
| 3-8 | 1 | 8 | 2 | tone-free | <100 | >1 | — |
| 3-9 | 2 | 8 | 2 | tone-free | <100 | >1 | — |
| 3-10 | 6 | 8 | 2 | tone-free | <100 | >1 | — |

C = Comparative Example

EXAMPLE 4

Mixed processing positive-negative

Radiation-sensitive compositions Nos. 4, 5 and 7 are used to perform mixed positive-negative-reversal processing.

Reversal processing using composition No. 4:

1. Imagewise exposure through continuous-tone step wedge, duration 20 seconds;
2. Conversion in a circulating air cabinet at 135° C. for two minutes;
3. Overall exposure without an original, 40 seconds.

Positive processing using composition No. 5:

1. Imagewise exposure, 20 seconds;
2. Heat-treatment at 80° C. for one minute to complete the acetal hydrolysis.

Negative processing using composition No. 7:
1. Imagewise exposure, 40 seconds.

Prior to development, the polyvinyl alcohol top layer is rinsed off with water. For development, the developers are diluted with deionized water at a ratio of 1:2 because of the high hydroxyl or acid numbers, respectively, of the binders used in the compositions. The following properties are evaluated: Impairment of development by the formation of flaky deposits (FD), foaming (F) or retarded or non-uniform development (−). Problem-free development is designated (+). The results are compiled in Table 6 below and show that problem-free mixed processing is possible with the developers of this invention.

| Example No. | Developer No. | Radiation-sensitive Composition No. | | |
|---|---|---|---|---|
| | | 4 Reversal | 5 Positive | 7 Negative |
| 4-1 (C) | 1 | − | + | − |
| 4-2 (C) | 2 | + | + | − |
| 4-3 (C) | 3 | F | F | F |
| 4-4 (C) | 4 | F | F | F |
| 4-5 (C) | 5 | F | F | F |
| 4-6 (C) | 6 | FD | FD | + |
| 4-7 | 7 | + | + | + |
| 4-8 | 8 | + | + | + |

(C) = Comparative Example

What is claimed is:

1. A developer composition for radiation-sensitive positive-working, negative-working and reversible reprographic layers which contain a binder which is insoluble in water but soluble in aqueous-alkaline solutions, the developer composition comprising:
   (a) O-carboxymethyl ethylene glycol or O,O'- bis-carboxymethyl ethylene glycol or O-carboxymethyl polyethylene glycol or O,O'-bis-carboxymethyl polyethylene glycol wherein the, polyethylene glycol comprises 2 to about 500 ethylene glycol units, wherein the,
   (b) at least one compound which shows an alkaline reaction in an aqueous solution, selected from the group consisting of alkali metal hydroxides, alkali metal silicates, alkali metal phosphates, alkali metal borates, ammonium hydroxides, ammonium silicates, ammonium phosphates and ammonium borates, and
   (c) water.

2. A developer composition as claimed in claim 1, comprising about 0.01 to 20% by weight, relative to the total weight of the composition, of (a).

3. A developer composition as claimed in claim 2, comprising 0.1 to 10% by weight of (a).

4. A developer composition as claimed in claim 1, wherein the substance showing alkaline reaction is selected from the group consisting of alkali metal hydroxide, alkali metal silicates, ammonium hydroxide and ammonium silicates.

5. A developer composition as claimed in claim 1, comprising an organic solvent in addition to components (a) to (c).

6. A developer composition as claimed in claim 1, additionally comprising at least one surfactant selected from the group consisting of cationic, anionic, non-ionic and amphoteric surfactants.

7. A developer composition as claimed in claim 1, additionally comprising a sequestering agent.

8. A developer composition as claimed in claim 1, additionally comprising a corrosion inhibitor.

9. A developer composition as claimed in claim 1, additionally comprising a hydrotropic substance.

10. A developer composition as claimed in claim 1, additionally comprising an antifoam agent.

11. A developer composition as claimed in claim 1, wherein (a) comprises an O-carboxymethyl- or O,O'-bis-carboxymethyl polyethylene glycol containing about 5 to about 50 ethylene glycol units.

12. A developer composition as claimed in claim 11, wherein (a) comprises and O,O'-bis-carboxymethyl polyethyleneglycol.

13. A developer composition as claimed in claim 12, wherein (b) comprises potassium silicate.

14. A developer composition as claimed in claim 13, comprising 0.1 to 10% by weight of said an O,O'-bis-carboxymethyl polyethyleneglycol and about 5 to 10% by weight of said potassium silicate, each percent based on the total weight of the developer composition.

15. A developer composition as claimed in claim 14, consisting essentially of 8.6 percent by weight of said potassium silicate and 0.5 percent by weight of said and O,O'-bis-carboxymethyl polyethyleneglycol, wherein the O,O'-bis-carboxymethyl polyethylene glycol is selected from the group consisting of O,O'-bis-carboxymethyl polyglycol-1000 and O,O'-bis-carboxymethyl polyglycol-600 with the remainder being water.

16. A developer composition as claimed in claim 1, comprising about 1 to 20% by weight of the composition of (b).

17. A developer composition as claimed in claim 16, comprising about 5 to 10% by weight of the composition of (b).

18. A developer composition in claimed in claim 1, wherein said (a) comprises O-carboxymethyl ethylene glycol of O,O'-bis-carboxymethyl ethylene glycol.

19. A developer composition as claimed in claim 1, wherein said (a) comprises an O-carboxymethyl polyethylene glycol.

20. A developer composition as claimed in claim 1, wherein said (a) comprises an O,O'-bis-carboxymethyl polyethylene glycol.

* * * * *